(12) United States Patent
Migairou et al.

(10) Patent No.: US 10,146,250 B2
(45) Date of Patent: Dec. 4, 2018

(54) METHOD AND CIRCUIT FOR ADJUSTING THE FREQUENCY OF A CLOCK SIGNAL

(71) Applicant: INSIDE SECURE, Meyreuil (FR)

(72) Inventors: Vincent Migairou, Trets (FR); Julien Roche, Arles (FR)

(73) Assignee: INSIDE SECURE, Meyreuil (FR)

( * ) Notice: Subject to any disclaimer, the term of this patent is extended or adjusted under 35 U.S.C. 154(b) by 121 days.

(21) Appl. No.: 15/268,085

(22) Filed: Sep. 16, 2016

(65) Prior Publication Data

US 2017/0003708 A1 Jan. 5, 2017

Related U.S. Application Data

(63) Continuation of application No. PCT/FR2015/050377, filed on Feb. 17, 2015.

(30) Foreign Application Priority Data

Mar. 20, 2014 (FR) ...................... 14 52351

(51) Int. Cl.
*G06F 1/00* (2006.01)
*G06F 1/12* (2006.01)
(Continued)

(52) U.S. Cl.
CPC .................. *G06F 1/12* (2013.01); *G06F 1/08* (2013.01); *G06F 13/4282* (2013.01);
(Continued)

(58) Field of Classification Search
CPC ........... G06F 1/12; G06F 1/08; G06F 13/4282
(Continued)

(56) References Cited

U.S. PATENT DOCUMENTS

| 5,815,043 A | 9/1998 | Chow et al. |
| 6,204,694 B1 | 3/2001 | Sunter et al. |

(Continued)

FOREIGN PATENT DOCUMENTS

EP 2549355 A1 1/2013

OTHER PUBLICATIONS

International Search Report and Written Opinion from corresponding application PCT/FR2015/050377, dated May 8, 2015, 10 pages.

*Primary Examiner* — Aurel Prifti
(74) *Attorney, Agent, or Firm* — Brake Hughes Bellermann LLP (57) ABSTRACT

In a general aspect, a method for adjusting an oscillator clock frequency can include applying a first control value to a first oscillator, applying a second control value, different from the first control value, to a second oscillator, measuring a frequency of each of the first and second oscillators, determining, by interpolation, a corrected frequency measurement of the second oscillator depending on a frequency deviation measured between the first and second oscillators when subjected to a third control value, on the third control value, and on the control value applied to the second oscillator, determining by interpolation a new first control value depending on the measured frequency of the first oscillator, on the corrected frequency, on the first and second control values, and on a desired frequency, and applying the new first control value to the first oscillator.

25 Claims, 5 Drawing Sheets

(51) Int. Cl.
*G06F 1/08* (2006.01)
*H03K 5/135* (2006.01)
*H03L 7/085* (2006.01)
*H03L 7/099* (2006.01)
*H03L 7/22* (2006.01)
*G06F 13/42* (2006.01)
*H03K 3/03* (2006.01)

(52) U.S. Cl.
CPC ........... *H03K 3/0315* (2013.01); *H03K 5/135* (2013.01); *H03L 7/085* (2013.01); *H03L 7/0997* (2013.01); *H03L 7/22* (2013.01); *G06F 2213/0042* (2013.01); *H03L 2207/50* (2013.01)

(58) Field of Classification Search
USPC ......... 713/400, 500, 501; 711/103; 327/158, 327/160, 291; 331/11
See application file for complete search history.

(56) References Cited

U.S. PATENT DOCUMENTS

| | | | | |
|---|---|---|---|---|
| 7,733,151 | B1* | 6/2010 | Yu | G06F 1/08 327/156 |
| 7,898,343 | B1* | 3/2011 | Janesch | H03L 7/087 331/11 |
| 8,595,543 | B2* | 11/2013 | Chiang | H04L 7/042 327/160 |
| 8,683,255 | B2* | 3/2014 | Koester | G06F 1/08 327/100 |
| 8,713,331 | B2* | 4/2014 | Kitagawa | G11C 5/063 327/158 |
| 2009/0019303 | A1* | 1/2009 | Rowland | G06F 1/08 713/501 |
| 2011/0066874 | A1* | 3/2011 | Shen | H04W 52/028 713/400 |
| 2012/0254510 | A1* | 10/2012 | Chen | G06F 1/08 711/103 |
| 2013/0021106 | A1 | 1/2013 | Bracmard et al. | |
| 2015/0082073 | A1* | 3/2015 | Yang | G06F 1/04 713/500 |

* cited by examiner

METHOD AND CIRCUIT FOR ADJUSTING THE FREQUENCY OF A CLOCK SIGNAL

CROSS REFERENCE TO RELATED APPLICATIONS

This application claims priority to and is a continuation of PCT Application No. PCT/FR2015/050377, filed Feb. 17, 2015. Both applications claim priority to French Application No. 1452351, filed Mar. 20, 2014, the disclosures of which are incorporated herein by reference in their entirety.

TECHNICAL FIELD

The present disclosure relates to a method for adjusting an oscillator frequency and an oscillator frequency adjusting circuit for adjusting the frequency of an oscillator. In particular, the present disclosure relates to method for enabling the clock frequency of a USB device (Universal Serial Bus) to be automatically adjusted and a USB device comprising such a clock frequency adjusting circuit.

BACKGROUND

The USB standard is based on a technical specification detailing communications between a host controller (such as a personal computer) and a device, for example a keyboard, a mouse, a digital camera, an external memory, etc., via an interface called a USB port. The USB 2.0 standard defines different data transfer rates, including a low rate mode at 1.5 Mb/s with a margin of accuracy of ±1.5%, and a full rate at 12 Mb/s with a margin of accuracy of ±0.25%.

As the host controller does not send any clock signal to the device, the device must generate its own clock signal with sufficient accuracy to comply with the required USB data transfer rate. A quartz crystal oscillator may be provided, but this solution is not suitable for low-cost applications and takes up too much space. An alternative solution is to base the generation of clock cycles on a synchronization signal sent by the host, for example a frame start signal or a "Keep Alive" maintenance signal sent in the absence of traffic to prevent the device from switching to idle state. In this case, the time interval between two consecutive synchronization signals is 1 ms. For a USB device operating at low rate, with a clock frequency of 6 MHz, a margin of accuracy of ±1.5% gives a frequency margin of ±90 KHz, giving between 5,910 and 6,090 clock cycles per time interval of 1 ms. For a USB device operating at full rate, with a clock frequency of 48 MHz, a margin of accuracy of ±0.25% gives a frequency margin of ±120 KHz, giving between 47,880 and 48,120 clock cycles per time interval of 1 ms.

Figure 1:
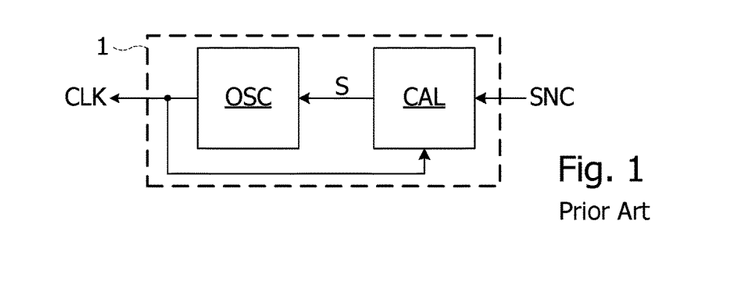
FIG. 1 described above shows a conventional clock frequency adjusting circuit.

FIG. 1 shows a clock frequency adjusting circuit 1 comprising an oscillator OSC and a calibration unit CAL. The oscillator OSC generates a clock signal CLK that is supplied to the calibration unit CAL. When the calibration unit CAL receives a first occurrence of a synchronization signal SNC, it starts counting the number of cycles of the clock signal CLK at its input until the next occurrence of the synchronization signal, when it stops counting. The calibration unit CAL determines the difference between the counted number of cycles and the desired number of cycles, then supplies the oscillator OSC with a control signal S, that increases or decreases its frequency accordingly.

It transpires that the frequency jump at output of the oscillator OSC resulting from the application of the control signal S is unknown. Indeed, the operation of the oscillator may vary with time, for example due to a variation in temperature or supply voltage, altering the operation of the oscillator. Thus, the frequency obtained at output of the oscillator may be too high or too low after the first adjustment phase.

The number of clock cycles is thus counted again upon the next time interval so as to determine the frequency pitch of the oscillator. The calibration unit CAL again supplies the oscillator OSC with the control signal S to obtain the desired frequency after the second time interval.

The application FR 2 978 258 (US 2013/0021106) describes a clock frequency adjusting circuit comprising two identical oscillators generating a clock signal the frequency of which can be adjusted by delay lines according to a control value, and a circuit configured to measure the frequency of each of the two oscillators, and determine new control values using the frequency measurements and the previous control values, and a desired frequency value. The accuracy of this frequency adjusting circuit depends on the identity of the behavior of the two oscillators. It can be seen that by increasing their frequency, the oscillators have diverging behaviors. Thus, this circuit offers an accuracy that may prove insufficient for certain transmission protocols. Such a divergence is also seen with the recent manufacturing technologies making it possible to further miniaturize integrated circuits. In particular, when the critical dimension (or the smallest transistor gate width) of the integrated circuit is lower than 100 nm, it is difficult to limit the divergences of features of oscillators to acceptable values, even if they are in a same integrated circuit.

It also transpires that the more the frequency of the oscillators is increased, the higher variations in frequency are induced by variations in circuit manufacturing conditions, ambient temperature and supply voltage, and thus the more the number of cycles necessary to reach the desired frequency increases.

The result is that in many applications, particularly data transmission applications, this solution does not enable the desired frequency to be reached sufficiently rapidly or accurately. In particular, this solution is not suitable for a USB device operating at full speed, i.e. with a clock signal at 48 MHz.

It is thus desirable to propose a clock circuit susceptible of being totally integrated, i.e. not requiring any components such as a quartz crystal. It is also desirable for this clock circuit to be rapidly able to reach a desired frequency, even if this frequency is high, and if the clock circuit is produced in accordance with the latest integrated circuit manufacturing technologies. It is also desirable for the desired frequency to be reached with sufficient accuracy.

SUMMARY

Some embodiments relate to a method for adjusting an oscillator clock frequency, comprising the steps of: applying a first control value to a first oscillator, applying a second control value different from the first control value, to a second oscillator, measuring a frequency of each of the first and second oscillators, determining by interpolation a new first control value depending on the frequencies measured, on the first and second control values, and on a desired frequency, and applying the new first control value to the first oscillator. According to one embodiment, the method comprises a step of determining by interpolation a corrected frequency measurement of the second oscillator, depending on a frequency deviation measured between the first and second oscillators subjected to the same third control value, on the third control value, and on the control value applied to the second oscillator, the corrected frequency measurement being used as frequency measurement of the second oscillator for determining the new first control value.

According to one embodiment, the method comprises a calibration phase comprising steps of: applying the third control value to each of the two oscillators, and measuring the frequency deviation between the frequencies of the two oscillators subjected to the third control value.

According to one embodiment, the method comprises a calibration phase comprising steps of: applying a minimum control value to each of the two oscillators, measuring a first frequency deviation between the frequencies of the two oscillators subjected to the minimum control value, applying a maximum control value to each of the two oscillators, measuring a second frequency deviation between the frequencies of the two oscillators subjected to the maximum control value, determining a slope deviation between response curves of the first and second oscillators depending on a difference between the first and second deviations and on a difference between the minimum and maximum control values, the slope deviation being used to determine by interpolation the corrected frequency measurement.

According to one embodiment, the corrected frequency measurement is determined depending on a frequency deviation measured between the first and second oscillators subjected to a minimum control value, and on the minimum control value.

According to one embodiment, the third control value is such that the measured frequency of the first oscillator subjected to the third control value, corresponds to the desired frequency.

According to one embodiment, the method comprises a calibration phase comprising steps of: determining the third control value, and measuring the frequency of the second oscillator subjected to the third control value.

According to one embodiment, each frequency measurement of one or other of the two oscillators comprises a step of counting a number of cycles of the oscillator during a period of a synchronization signal.

According to one embodiment, the synchronization signal is supplied by a communication interface.

According to one embodiment, the method comprises a step of supplying a signal at the frequency of the first oscillator, at the output of the first oscillator, as clock signal of a device conforming to the USB 2.0 standard, the frequency of the first oscillator being equal to 6 MHz with an error margin of ±90 KHz, or to 48 MHz with an error margin of ±120 KHz.

According to one embodiment, the determination of the new first control value comprises steps of: determining a first difference between the measured frequencies of the first and second oscillators, determining a second difference between the desired frequency and the measured frequency of one of the first and second oscillators, dividing the first difference by a difference in control values applied to the first and second oscillators, to obtain a frequency pitch, dividing the second difference by the frequency pitch to obtain a correction value, and adding the correction value to the first control value to obtain the new control value.

According to one embodiment, the difference in control values is set (fixed), a new second control value is determined depending on the new first control value or on the correction value to keep the difference in control values Some embodiments also relate to a frequency adjusting circuit for adjusting the frequency of an oscillator to a desired frequency, comprising first and second oscillators each having a frequency adjustable by a control value, the frequency adjusting circuit being configured to implement the method defined above.

According to one embodiment, each of the first and second oscillators comprises a ring oscillator comprising delay circuits that can be activated separately according to the control value applied to the oscillator.

Some embodiments also relate to a USB 2.0 device comprising: an interface circuit receiving a data signal conforming to the USB 2.0 standard, and the frequency adjusting circuit defined above.

According to one embodiment, the interface circuit supplies the frequency adjusting circuit with the synchronization signal.

BRIEF DESCRIPTION OF DRAWINGS

Some examples of embodiments will be described below in relation with, but not limited to, the following figures, in which.

DETAILED DESCRIPTION

Figure 2:
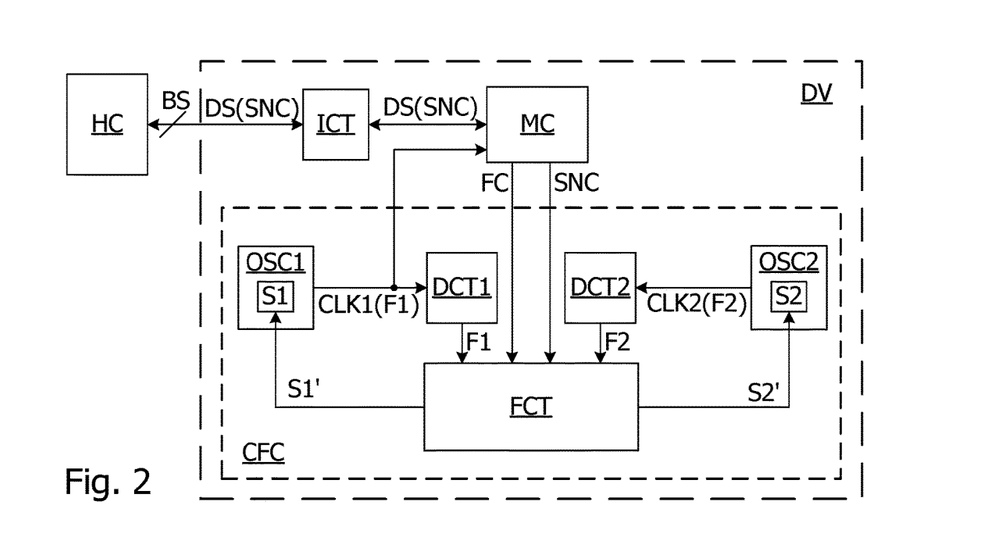
FIG. 2 represents in block form a device comprising an oscillator clock frequency adjusting circuit, according to one embodiment.

FIG. 2 represents a device DV comprising a communication interface ICT, a microcontroller MC, and a clock frequency adjusting circuit CFC according to one embodiment. The device DV is coupled to a host controller HC via the interface circuit ICT by means of a bus BS. The microcontroller MC is coupled to the interface circuit ICT and to the circuit CFC by means of coupling wires.

The circuit CFC comprises two oscillators OSC1, OSC2, two frequency measuring circuits DCT1, DCT2, and a calculation circuit FCT for determining frequency adjusting commands to be applied to the oscillators. Each of the oscillators OSC1, OSC2 receives from the circuit FCT a control value S1, S2 respectively. The control value S1, S2 corresponds to a frequency adjustment (delay or advance) that can be applied to the oscillator to adjust its frequency upward or downward.

A data signal DS is transmitted between the host controller HC and the device DV by means of the bus BS. A synchronization signal SNC, such as a maintenance signal or a frame start signal according to the USB 2.0 standard, is included in the data signal and transferred to the microcontroller MC via the interface circuit ICT. The microcontroller MC then transfers the signal SNC to the circuit CFC.

The synchronization signal SNC defines periods or time intervals, a time interval representing the time between two consecutive occurrences or pulses of the signal SNC. The microcontroller MC also supplies the calculation circuit FCT with a desired frequency value FC corresponding to the clock signal frequency required for its data transfer needs, for example 6 MHz or 48 MHz.

Upon a first time interval, the oscillator OSC1 operates with a control value S1, and generates a clock signal CLK1 having a frequency F1. The clock signal CLK1(F1) is supplied to the microcontroller MC for its own needs and to the measuring circuit DCT1. The measuring circuit DCT1 measures the frequency of the clock signal at input and supplies at output the circuit FCT with the frequency measurement F1. Similarly, the oscillator OSC2 operates with a control value S2, and generates a clock signal CLK2 having a frequency F2. The clock signal CLK2(F2) is supplied to the measuring circuit DCT2. The measuring circuit DCT2 measures the frequency of the clock signal at input and supplies at output the circuit FCT with the frequency measurement F2.

The calculation circuit FCT then calculates a new control value S1' using the frequency values F1, F2, the control values S1, S2, and the desired frequency value FC. The new control value S1' is applied to the oscillator OSC1 upon a next time interval so as to obtain the desired frequency FC at output of the oscillator OSC1. Optionally, a new control value S2' may be determined and applied to the oscillator OSC2 in a similar manner.

Figure 3:
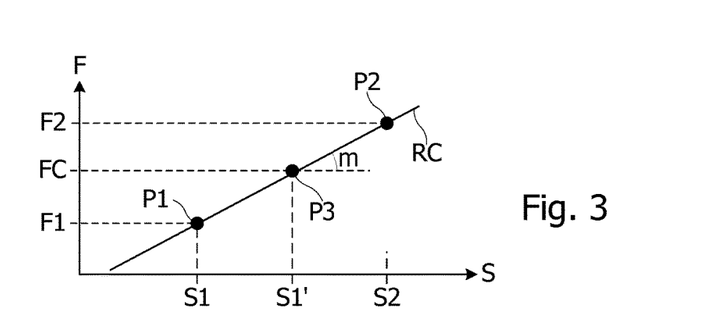
FIG. 3 is a graph indicating the relationship between the frequency and control values of the oscillator for the frequency adjusting circuit in FIG. 2.

FIG. 3 is a graph showing the relationship between the frequency values F and the control values S of the oscillators OSC1, OSC2 at a certain time interval. A point P1 corresponds to the frequency F1 of the oscillator OSC1 and to its control value S1. A point P2 corresponds to the frequency F2 of the oscillator OSC2 and to its control value S2. A response curve RC is extrapolated using the points P1, P2. A point P3 on the curve RC corresponds to the desired frequency FC of the oscillator OSC1 and to the new control value S1' to be applied to the oscillator OSC1 upon the next time interval so as to obtain the desired frequency FC. The shape or the slope of the curve RC and its position in relation to the axes of controls and frequencies varies from one circuit to another and according to the ambient temperature and the supply voltage of the circuit. However, as both oscillators are produced in a same circuit, this curve is the same for both oscillators and varies in the same way according to the ambient temperature and the supply voltage of the circuit. In the example in FIG. 3, the frequencies F1, F2 and the control values S1, S2 are respectively higher and lower than the desired frequency FC and lower than the control value S1'. It will be understood that, in other cases, the frequencies F1, F2 and the control values S1, S2 may all be higher or lower than the frequency FC and higher or lower than the control value S1'.

As a result, the control value S1' may be determined using the values F1, S1, F2, S2, FC by using the relationships between the points P1, P2, P3. For example, assuming that the response curve RC is a straight line, it is well known that to find the slope p of a straight line defined by two points p1(x1, y1) and p2(x2, y2), it is possible to use the following general equation:

$$p=(y1-y2)/(x1-x2) \quad (1)$$

in which p is the slope and (x1, y1) and (x2, y2) are respectively the coordinates of the two points P1, P2.

The clock frequency adjusting circuit CFC, and more particularly the calculation circuit FCT shown in FIG. 2, calculates the new frequency control value S1' so as to obtain the desired frequency FC by implementing the equations shown below. Specifically, the new control value S1' can be calculated thanks to the following equations and to the frequency values F1, F2 of the oscillators OSC1, OSC2, to the control values S1, S2, and to the desired frequency value FC.

The slope p of the response curve RC passing via the points P1, P2, P3 is equal to:

$$P = (FC - F1)/(S1' - S1) \quad (2)$$
$$= (F1 - F2)/(S1 - S2) \quad (3)$$

The equation (2) enables the new control value S1' to be deduced:

$$S1'=S1+(FC-F1)/p \quad (4)$$

The term (F1–FC)/p is a "correction" CR1 that is added to S1. This correction CR1 may be a negative or positive value, depending on the respective positions of the points P1, P2 in relation to the point P3. If the frequency F1 of the oscillator is higher than the desired frequency, the control value S1 of the oscillator OSC1 is decreased instead of being increased so as to obtain the new control value S1'.

Since F1, F2, S1, S2 are known values, the slope p of the response curve RC can be directly calculated using the equation (3) as follows:

$$p=(F1-F2)/(S1-S2) \quad (5)$$

As a result, the new control value S1' can be calculated by replacing the equation (5) in the equation (4) as follows:

$$S1'=S1+(FC-F1)/[(F1-F2)/(S1-S2)] \quad (6)$$

$$\text{i.e. } S1'=S1+\Delta Fx/\Delta Fr/\Delta S \quad (7)$$

The result is that the correction CR1 can be obtained by the following equation:

$$CR1=\Delta Fx/\Delta Fr/\Delta S \quad (8)$$

Figure 4:
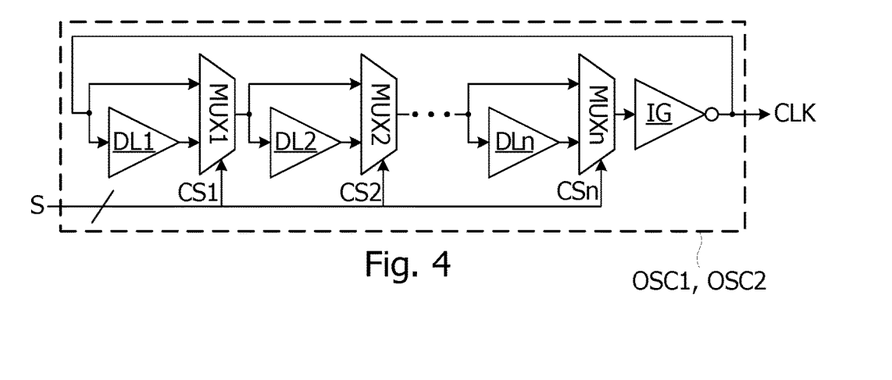
FIG. 4 is a schematic diagram of an oscillator present in the frequency adjusting circuit in FIG. 2.

FIG. 4 is a schematic diagram of an oscillator of the ring oscillator type. According to one embodiment, each oscillator OSC1, OSC2 comprises such an oscillator. The oscillator OSC1, OSC2 comprises an inverter gate IG, n delay circuits DL1 to DLn, and n multiplexer circuits MUX1 to MUXn, for a total n of groups of delay and multiplexer circuits DL-MUX. The maximum number n of groups of delay-multiplexer circuits may vary from a few to several hundred groups, depending on the required degree of accuracy, the space available for the oscillator, etc. Therefore, in one example of an embodiment, the oscillator OSC1, OSC2 comprises 512 groups of delay and multiplexer circuits DL-MUX.

Each multiplexer MUX1-MUXn has an input connected to an output of the corresponding delay circuit DL1-DLn, and an input connected to a link that bypasses the corresponding delay circuit. Each multiplexer is controlled by the control value S, for example a control signal CS0, CS1, . . . CSn obtained from a decoding (not represented on FIG. 4) of the control value S. The input of the inverter gate IG is connected to the output of the last multiplexer MUXn and the output of the gate IG supplies the clock signal CLK, that is also supplied to the first delay circuit DL1 and to the first multiplexer MUX1.

As an example, for an oscillator comprising a total of n=32 groups of delay-multiplexer circuits DL-MUX, a control value S=10 will lead ten of the multiplexers MUX1-MUXn to select the input bypassing the corresponding delay circuit, the other multiplexers selecting the input coupled to the corresponding delay circuit. The result is that the maximum frequency at output of the oscillator is decreased by ten times the delay of one of the delay circuits DL1-DLn. If it is later necessary to reduce the frequency of the oscillator, the control value S may be reduced, for example to S=8 so as to select two of the delay circuits DL1-DLn, decreasing the frequency at output by twice the value of the delay. Therefore, the control value S determines the number of multiplexers MUX1-MUXn selecting their non-delayed input.

It must be understood that the higher the control value S of the oscillator OSC1, OSC2, the higher the number of multiplexers MUX to select the non-delayed inputs, the lower the delay, and the higher the clock frequency is. A frequency pitch ΔFS is defined as the result at output of the oscillator of the difference in number of clock cycles N due to an adjustment of the control value S by a single pitch (by selecting or deselecting only one delay circuit DL of the oscillator). The frequency pitch ΔFS thus corresponds to the delay introduced by a delay circuit DL.

During a phase of designing the oscillators OSC1, OSC2, the delay of each delay circuit is calculated, and the number of delay cells is chosen such that the target frequency can be reached in all working conditions: best scenario, typical scenario and worst scenario. The number of delay circuits DL1-DLn that can be activated by the control signals CS1-CSn among the n groups of delay-multiplexer circuits available for an oscillator, is between a minimum number corresponding to a maximum control value SM and a maximum number corresponding to a minimum control value Sm. In general, the value Sm is equal to zero and the value SM is equal to the total number n of groups of delay-multiplexer circuits. However, depending on the design and manufacturing of the oscillator, these values may vary. For example, it may be determined that for the oscillator to be capable of reaching the target frequency FC, at least five delay circuits DL must never be activated. In this case, Sm may be chosen equal to 5.

Preferably, the selection of the delay circuits DL leads to a linear variation in the frequency at output of the oscillator. Moreover, the oscillators OSC1, OSC2 are preferably designed to be as identical as possible, to obtain the best possible accuracy when calculating each of the new control values S.

Figure 5:
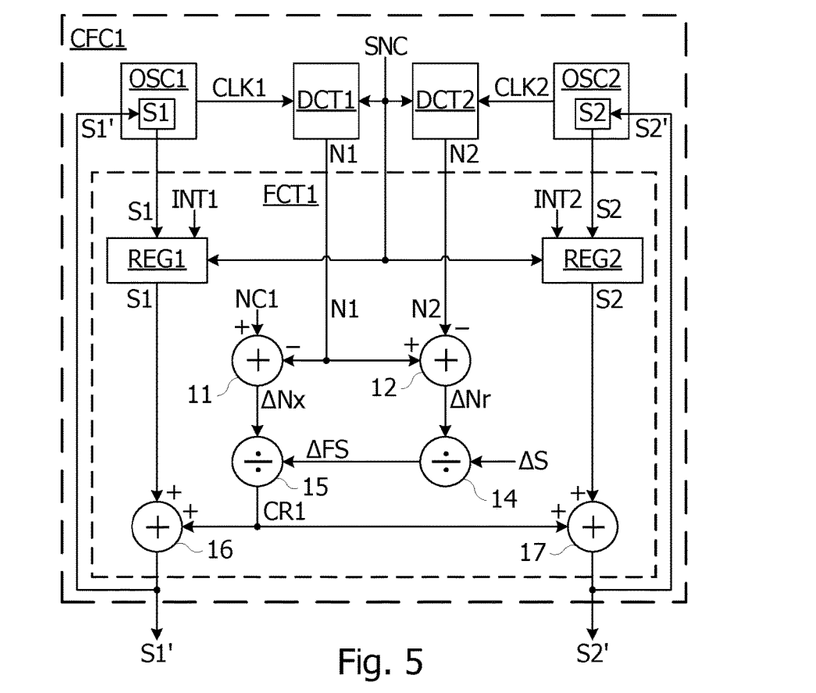
FIG. 5 is a schematic diagram of the frequency adjusting circuit in FIG. 2, according to one embodiment.

FIG. 5 is a schematic diagram of a clock frequency adjusting circuit CFC1 according to one embodiment. The circuit CFC1 comprises the oscillators OSC1, OSC2, the frequency measuring circuits DCT1, DCT2, and a control value calculation circuit FCT1.

Upon a first time interval, the oscillator OSC1 operates with a control value S1, and generates a clock signal CLK1 having a frequency value F1. The clock signal CLK1(F1) is supplied to the microcontroller MC (not represented) for its own needs and to the circuit DCT1. The measuring circuit DCT1 may comprise for example a counter receiving at input the synchronization signal SNC and the clock signal CLK1. Upon receiving a first occurrence (for example a rising or falling edge) of the synchronization signal SNC, the circuit DCT1 starts counting the number of clock cycles of the clock signal CLK1 at its input. Upon receiving a second occurrence of the synchronization signal SNC, the circuit DCT1 stops counting the number of clock cycles and supplies at output the calculation circuit FCT1 with a count value of clock cycles N1 of the signal CLK1.

In the same way, the oscillator OSC2 operates with a control value S2, and generates a clock signal CLK2 having a frequency value F2. The clock signal CLK2(F2) is supplied to the circuit DCT2, which also receives at input the synchronization signal SNC and counts the number of clock cycles of the clock signal CLK2 between two occurrences of the synchronization signal SNC. The measuring circuit DCT2 supplies at output the calculation circuit FCT1 with a count value of clock cycles N2 of the signal CLK2.

The calculation circuit FCT1 comprises two registers REG1, REG2, two summers 11, 12, two dividers 14, 15, and two summers 16, 17. Each of the registers REG1, REG2 receives at input the current control value of the corresponding oscillator OSC1, OSC2 (here the control values S1, S2), the synchronization signal SNC, and initial values INT1, INT2 supplied by the microcontroller MC for example.

Initially, for the first use of the device, the registers REG1, REG2 are loaded with respective initial control values INT1, INT2 determined for example by the microcontroller MC, and the oscillator OSC1, OSC2 is also set on (fixed as) this control value. Therefore, upon receiving an occurrence of the synchronization signal SNC, the register REG1, REG2 is loaded with the current control value S1, S2 of the corresponding oscillator OSC1, OSC2, and supplies at output the summer 16, 17 with the value S1, S2. Therefore, the oscillator OSC1 may initially receive from the microcontroller MC as initial value INT1, the control value SC1 corresponding to the desired count value NC1, as determined during a calibration phase and stored by the microcontroller MC. The oscillator OSC2 may initially receive from the microcontroller MC as initial value INT2, the control value SC1−ΔS, the difference ΔS being an operation parameter MC stored by the microcontroller and defined during a phase of configuring the calculation circuit FCT1, FCT2.

The summer 11 receives at a non-inverting input the desired count value NC1, for example supplied by the microcontroller MC, and at an inverting input the measured count value N1, supplied by the circuit DCT1. The summer 11 calculates the difference ΔNx (=NC1−N1) between the desired count value NC1 and the measured count value N1, and supplies at output the summer 12 with the difference ΔNx. The summer 12 receives at a non-inverting input the measured count value N1 supplied by the circuit DCT1, and at an inverting input the measured count value N2, supplied by the circuit DCT2. The summer 12 calculates the difference ΔNr (=N1−N2) representing the difference between the measured count values N1, N2 of the oscillators OSC1, OSC2.

The divider 14 receives at a first input the difference ΔNr calculated by the summer 12, and at a second input, the difference ΔS (=S1−S2) between the control values S1, S2 of the oscillators OSC1, OSC2. The difference ΔS may be a value set, stored and supplied by the microcontroller MC. The divider 14 divides the first input by the second input ΔNr/ΔS, so as to find the slope p, in line with the equation (5) above. The slope p corresponds to the frequency pitch ΔFS of the two oscillators OSC1, OSC2, for a control value pitch S of the oscillators.

The divider 15 receives from the summer 11 at a first input the difference ΔNx (corresponding to the frequency difference ΔFx), and at a second input the frequency pitch ΔFS supplied by the divider 14. The divider 15 divides the first input by the second input ΔNx/ΔFS, so as to find the correction CR1 according to the equation (8) above.

The summer 16 receives at an input the correction CR1 from the divider 15, and at another input the control value S1 stored in the register REG1. The summer 16 adds the correction CR1 to the control value S1, in line with the equation (7). Therefore, if the value of the count N1 is higher than the desired value NC1, the difference ΔNx is negative. The correction CR1 is thus also negative. The result is that the control value S1' is lower than the control value S1, which leads to increasing the delay of the oscillator OSC1. Conversely, if the value of the count N1 is lower than the desired value NC1, the correction CR1 is positive, and the control value S1' is higher than the control value S1, which leads to reducing the delay of the oscillator OSC1. The summer 16 supplies the oscillator OSC1 with the new control value S1', the oscillator adjusting its frequency accordingly so as to obtain the desired count NC1. The new control value S1' is also loaded in the register REG1, by replacing the previous control value S1.

Similarly, the summer 17 receives at an input the correction CR1 supplied by the divider 15, and at another input the control value S2 stored in the register REG2. The summer 17 adds the correction CR1 to the control value S2, then supplies the new control value S2' to the oscillator OSC2, which adjusts its frequency accordingly. The new control value S2' is also loaded in the register REG2, by replacing the previous control value S2.

Instead of calculating the new control value S2' of the oscillator OSC2 from the current control value S2, the value S2' can be obtained by adding the difference ΔS to the new control value S1' of the oscillator OSC1.

It is possible to consider calculating the difference ΔS between the control values S1, S2 upon each calculation of new control values S1', S2'. In this case, it is preferable, but not necessary, to modify the control value S2 of the oscillator OSC2 every time the control value S1 of the oscillator OSC1 is modified, so as to keep the difference between the control values S1, S2 constant. It is also preferable to avoid the control values S1, S2 being equal so that a correction CR1 can always be calculated. Indeed, if the difference in control values ΔS is zero, the divider 14 will perform a division by 0.

According to one embodiment, the difference ΔS between S1 and S2 is set to a power of 2. This simplifies the division by the divider 14 to find the frequency pitch ΔFS, since dividing a number by two amounts to moving one bit to the right of the result, the least significant bit being either neglected or moved in decimal position. This embodiment enables a low-cost divider to be used. For example, ΔS=S1−S2 is set to 2x. Thus, after the application of a correction CR1 to the oscillator OSC1, the oscillator OSC2 can also be adjusted to maintain a difference of a power of two 2x with the oscillator OSC1.

It shall be noted that the choice of a high value for the difference ΔS enables a better accuracy to be obtained, provided that the response curve CR of the oscillators OSC1, OSC2 is a straight line. In the opposite case, the difference ΔS may be chosen such that the response curve between two values spaced out by the difference ΔS can be considered equivalent to a straight line.

NUMERICAL EXAMPLES

As a first example, it is assumed that upon a time interval, N1=6,500, S1=24, N2=5,500, S2=16 (the difference ΔS is set to 8), and NC1=6,000. The calculation circuit FCT1 calculates ΔNx=−500 and ΔNr=1,000. The frequency pitch ΔFS is equal to 1,000/8=125, and the correction CR1 is assessed at −500/125=−4. The new control value S1' is thus equal to 24+(−4)=20 to increase the delay of the oscillator OSC1 and obtain the desired count of NC1=6,000, that corresponds to the frequency FC of 6 MHz. The delay of the oscillator OSC2 can be increased by the same correction thanks to a control value S2'=12, so as to maintain the frequency difference ΔS (=S1−S2) between the two oscillators OSC1, OSC2.

Upon the next time interval, N1=6,000, S1=20, N2=5,000, S2=12, and NC1=6,000. As the difference ΔNx between the count N1 of the oscillator OSC1 and the desired count NC1 of the oscillator OSC1 is equal to 0, the frequency of the oscillator OSC1 does not need to be adjusted. The desired frequency FC is thus reached after only one time interval.

If for a subsequent time interval, the frequencies of the oscillators OSC1, OSC2 begin to drift, for example due to an increase in temperature, the difference between the measured count N1 of the oscillator OSC1 and the desired count NC1 is no longer equal to zero, and the frequency may be adjusted again. Thus, for example, N1=5,750, S1=20, N2=4,750, S2=12, and NC1=6,000. The calculation circuit FCT1 calculates ΔNx=400 and ΔNr=1,000. The frequency pitch ΔFS=1,000/8=125, and the correction CR1=250/125=2. The new control value S1' is equal to 20+2=22 to reduce the delay of the oscillator OSC1. The delay of the oscillator OSC2 can be reduced by the same correction to obtain a control value S2'=14.

It will also be understood that a non-whole number can be calculated for the control value S1'. In this case, the control value S1' applied to the oscillator OSC1 can be rounded up or down to the closest whole number, as it is not possible to add or subtract a fraction of a delay circuit DL. The real count at output of the oscillator will not be exactly equal to the desired count, but will very likely be within the range of acceptable accuracy of the oscillator.

As an example to illustrate the latter point, it is assumed that N1=6,300, S1=26, N2=5,400, S2=18, ΔS=8 and NC1=6,000. The calculation circuit FCT1 calculates ΔNx=−300 and ΔNr=900. The frequency pitch ΔFS is equal to 900/8=112.5 and the correction CR1 is equal to −300/112.5=2.6, that is rounded up to 3. The new control value S1' is set to 23 to reduce the frequency of the oscillator OSC1 so as to obtain a count of approximately 6,006, which is within the range of accuracy (±1.5%) between 5,910 and 6,090 of the desired frequency, as required by the USB 2.0 standard.

In certain conditions, it may be difficult to produce two oscillators having sufficiently similar operating characteristics, in particular sufficiently similar slopes p, such that the control values S1 and S2 cannot be calculated with sufficient accuracy to reach the desired frequency sufficiently rapidly. This difficulty producing two identical oscillators appears in particular with oscillators having a high frequency (in particular higher than 30 MHz), and in integrated circuits with a high density of components, obtained by the latest manufacturing technologies having a critical dimension lower than 100 nm.

Figure 6:
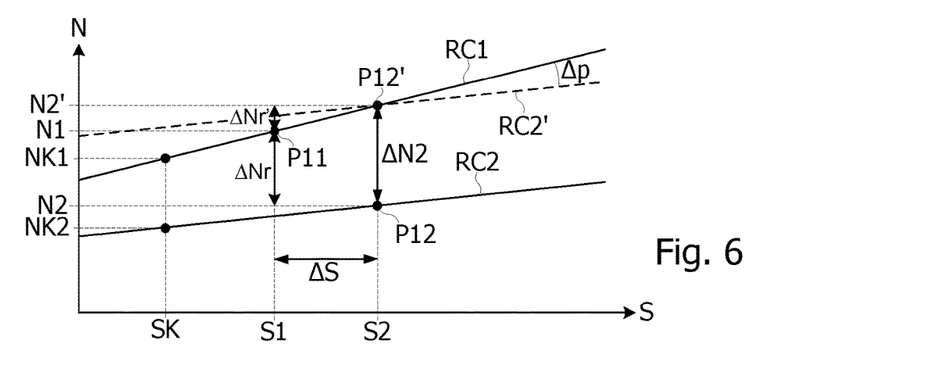
FIGS. 6 to 8 are graphs indicating curves of the variation in the frequencies of the two oscillators of the frequency adjusting circuit in FIG. 2, depending on a control value.

FIG. 6 is a graph showing a case in which the two oscillators have response curves RC1, RC2 different from the output frequency F (or from the count N) depending on the control value S. The slope or shape of these response curves vary from one circuit to another and according to the ambient temperature and the supply voltage of the circuit.

However, as the two oscillators are formed in the same integrated circuit, the deviation between the two curves remains substantially constant, and thus does not vary significantly according to the ambient temperature or the supply voltage of the circuit. If the two oscillators do not have the same response curve in frequency F or count N, depending on the control value S, the measured deviation ΔNr equal to N1−N2, is different from the deviation ΔNr'=N1−N2' that should be taken into account for the calculation done by the circuit FCT1 in FIG. 5, i.e. assuming that the two oscillators OSC1, OSC2 have the same response curve RC1. To assess the real deviation ΔNr' or the count value N2', the point P11 of the curve RC1 having the coordinates (S1, N1), the point P12 of the curve RC2 having the coordinates (S2, N2) and the point P12' of the curve RC1 having the coordinates (S2, N2') should be considered. FIG. 6 also represents a curve RC2' parallel to the curve RC2 and passing via the point P12'. The slope deviation between the curves RC1 and RC2 thus corresponds to the slope deviation Δp between the curves RC1 and RC2'. By a linear approximation (assuming that the response curves are straight lines), the slope deviation Δp between the curves RC1 and RC2 can be expressed in the following manner:

$$\Delta p=[(N2'-N2)-(NK1-NK2)]/(S2-SK) \quad (9)$$

NK1 and NK2 being known count values, measured at output of the oscillators OSC1, OSC2 receiving a same control value SK that is also known. The result is that a corrected count N2C can be assessed in the following manner:

$$N2C=N2'=N2+(NK1-NK2)+\Delta p \cdot (S2-SK) \quad (10)$$

in which the quantity CR2=(NK1−NK2)+Δp·(S2−SK) represents a correction to be added to the measured count N2 to obtain the corrected count value N2C.

Figure 7:
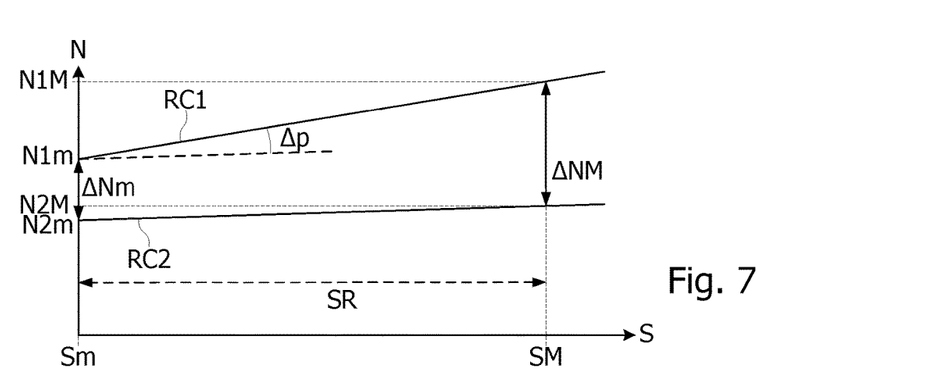

To determine the slope deviation Δp, we will consider FIG. 7 representing the response curves RC1, RC2. The slope deviation Δp can be assessed by measuring the deviations between the two curves RC12, RC2 at their ends, i.e. by applying to the oscillators OSC1, OSC2 the extreme values Sm, SM of the control value S, and by measuring the counts N1$m$, N2$m$, N1M, N2M at these extreme values. The slope deviation Δp can be obtained by an equation similar to the equation (9), as follows:

$$\Delta p=[(N1M-N2M)-(N1m-N2m)]/(SM-Sm) \quad (11)$$

i.e., by setting down ΔNM=(N1M−N2M), ΔNm=(N1$m$−N2$m$), and SR=SM−Sm:

$$\Delta p=(\Delta NM-\Delta Nm)/SR \quad (12)$$

SR represents the range of the control values of the oscillators OSC1, OSC2.

One or other of the count values at the extreme values Sm, SM can be used as known values in the equation (10). Therefore, the corrected count value N2C can be obtained using the following equation:

$$N2C=N2+\Delta Nm+\Delta p \cdot (S2-Sm) \quad (13)$$

I.e., if Sm is equal to 0:

$$N2C=N2+\Delta Nm+\Delta p \cdot S2 \quad (14)$$

Figure 8:
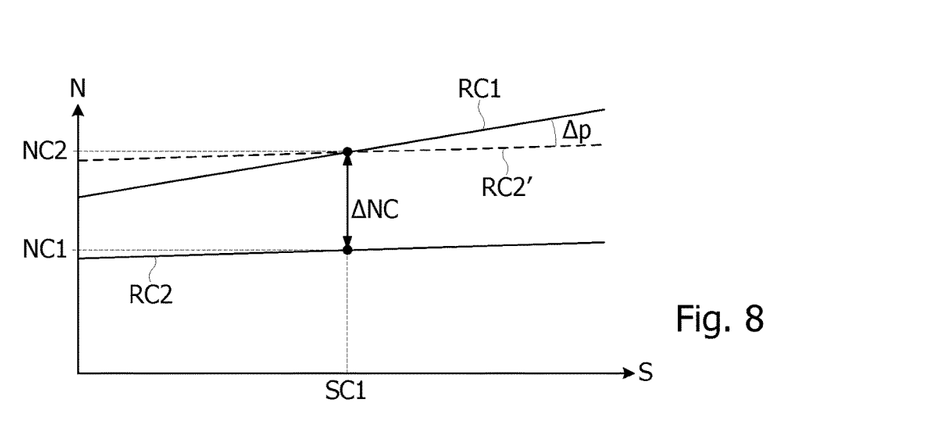

According to another embodiment, the count value NC1 that corresponds to the desired frequency FC, and which is obtained with a control value SC1 determined during a phase of calibrating the circuit CFC, is used as known count value relating to the oscillator OSC1. FIG. 8 represents the curves RC1, RC2, RC2', the desired count value NC1 on the curve RC1, and the corresponding control SC1 and count values coming from the oscillator OSC2 for this same control value SC1. Therefore, the corrected count value N2C can be obtained using the following equation:

$$N2C=N2+\Delta NC+\Delta p \cdot (S2-SC1) \quad (15)$$

with ΔNC=NC1−NC2 and Δp=(ΔNM−ΔNm)/SR.

Figure 9:
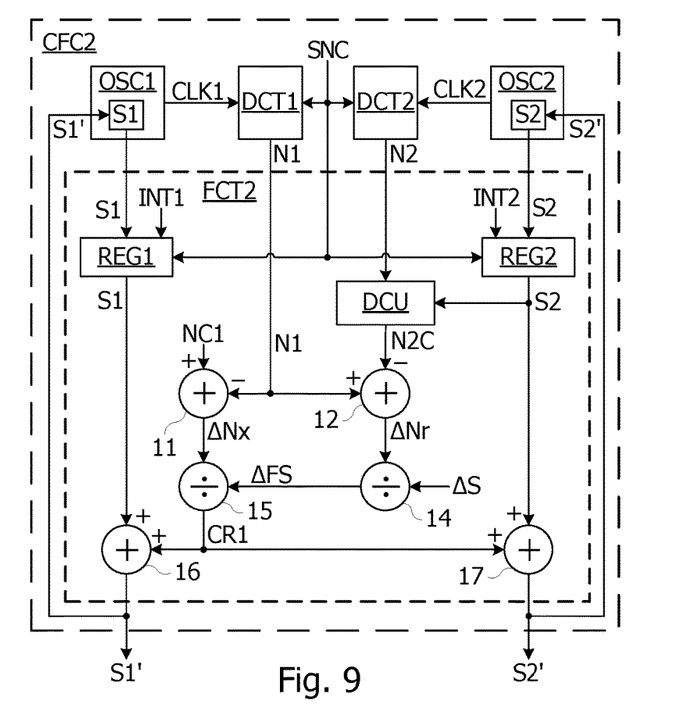
FIG. 9 represents a schematic diagram of the frequency adjusting circuit in FIG. 2, according to another embodiment.

FIG. 9 is a schematic diagram of a clock frequency adjusting circuit CFC2 according to another embodiment. The circuit CFC2 comprises, like the circuit CFC1, the oscillators OSC1, OSC2, the frequency measuring circuits DCT1, DCT2, and a control value calculation circuit FCT2 replacing the circuit FCT1 in this embodiment. The calculation circuit FCT2 differs from the calculation circuit FCT1 in that it comprises a count correction circuit DCU arranged at input of the summer 12 (between the counter DCT2 and the summer 12). The circuit DCU is configured to implement the equation (10), or more precisely the equation (13), (14) or (15), so as to determine the corrected value N2C that is provided at input of the summer 12 by replacing the count value N2.

Figure 10:
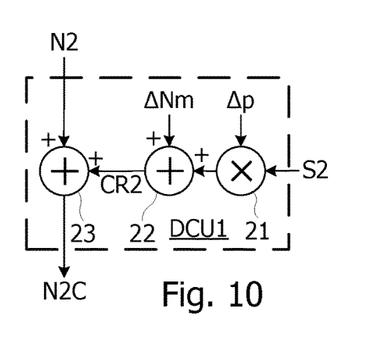
FIGS. 10 and 11 represent in block form a correction circuit present in the circuit in FIG. 9, according to two distinct embodiments.

FIG. 10 is a schematic diagram of a correction circuit DCU, according to one embodiment. The circuit DCU1 represented in FIG. 10 implements the equation (14). The circuit DCU1 comprises a multiplier 21 and two summers 22, 23. The multiplier 21 receives the control value S2 from the register REG2, and the slope deviation Δp from the microcontroller MC. The multiplier 21 supplies the quantity Δp·S2 at an input of the summer 22. Furthermore, the summer 22 receives from the microcontroller the deviation in counts ΔNm of the oscillators OSC1, OSC2 at the minimum control value Sm. The summer 22 supplies the correction value CR2 (=ΔNm+Δp·S2) at an input of the summer 23. Furthermore, the summer 23 receives the count value N2 to be corrected and supplies the corrected count value N2C (=N2+ΔNm+Δp·S2) at output of the circuit DCU1.

Figure 11:
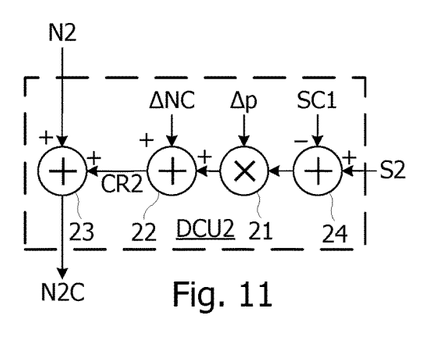

FIG. 11 is a schematic diagram of a correction circuit DCU, according to another embodiment. The circuit DCU2 represented in FIG. 11 implements the equation (15). The circuit DCU2 differs from the circuit DCU1 in that it comprises an additional summer 24 interposed between the input of the control value S2 and the input of the summer 21. Therefore, the summer 21 comprises a non-inverting input receiving the control value S2 from the register REG2 and an inverting input receiving the control value SC1 corresponding to the desired count value NC1 for the oscillator OSC1, supplied by the microcontroller MC. The summer 24 thus supplies the quantity S2−SC1 at input of the multiplier 21. Furthermore, instead of receiving the deviation ΔNm, the summer 22 receives the deviation ΔNC (=N1C−N2C) in accordance with the equation (15).

The circuit CFC2 thus enables a precisely synchronized clock signal (CLK1) to be generated, as soon as the counts N1, N2 are obtained, i.e. as soon as the circuit receives a second occurrence of the synchronization signal SNC.

Finally, the microcontroller MC stores and supplies the calculation circuit FCT2 with the following values: NC1, SC1, ΔS, Δp, and ΔNm or ΔNC. The deviation in control values ΔS is an operating parameter to be defined and introduced in the microcontroller MC. The other values may be determined during a process of calibrating the oscillators OSC1, OSC2, for example performed by the microcontroller MC. The calibration process may be carried out only once, for example at the end of the production line of the circuit, by subjecting it to an average ambient temperature (for example between 20 and 25° C.).

Figure 12:
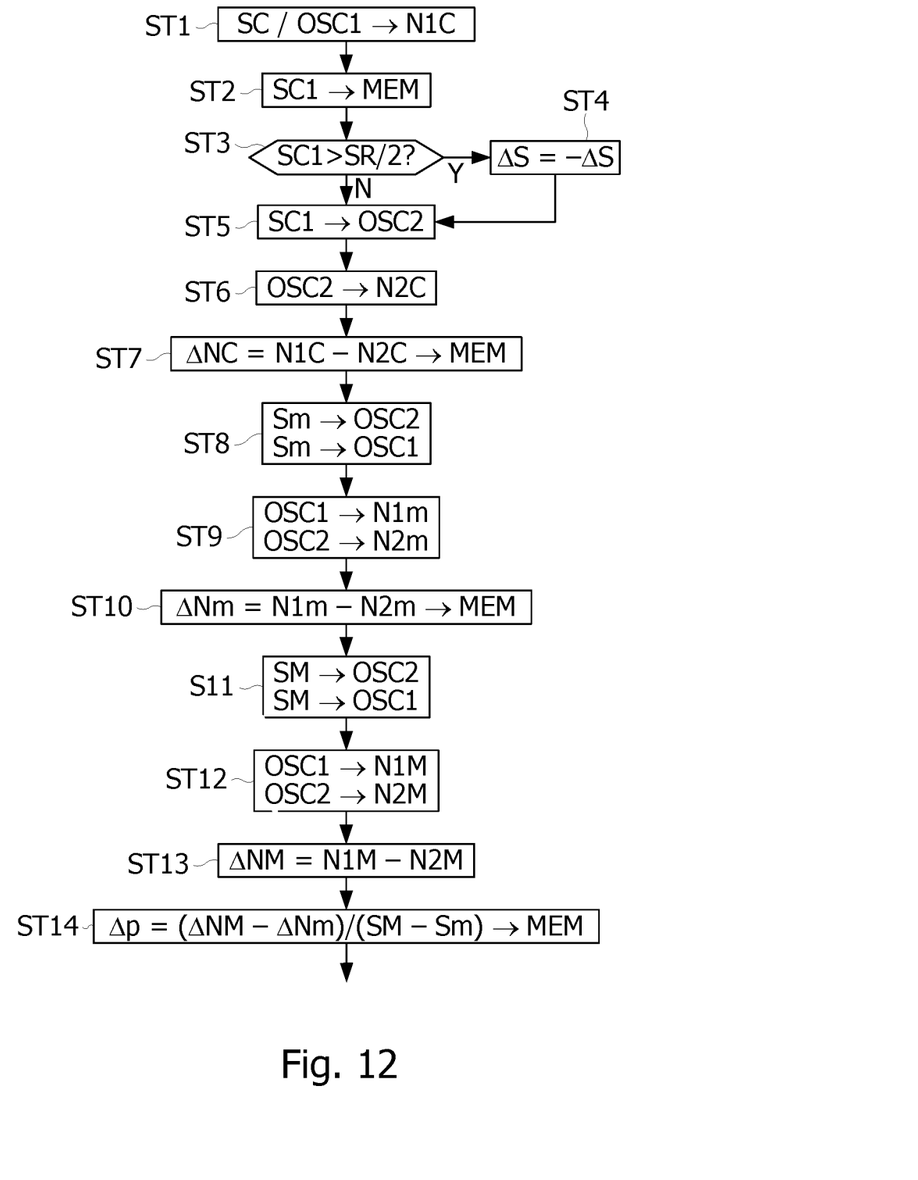
FIG. 12 represents a sequence of steps executed during a phase of calibrating the frequency adjusting circuit in FIG. 9.

Steps ST1 to ST14 of a calibration process, according to one embodiment, are represented on FIG. 12. In step ST1, control values S1 are applied successively to the oscillator OSC1, and upon each control value, the count value N1 is measured on the output signal of the oscillator OSC1, until this count value is equal to the desired count value N1C. For the oscillator OSC1 to reach the value N1C, the microcontroller MC may select the control values S1 by dichotomy, from a median value (=SR/2) of the range of control values SR. In step ST2, the control value SC1 found in step ST1 is stored. In step ST3, the control value SC1 can be compared with the median value SR/2 of the range of control values SR. If the value SC1 is higher than the median value SR/2, step ST4 is executed before steps ST5 to ST14, otherwise only steps ST5 to ST14 are executed. In step ST4, the sign of the deviation ΔS stored by the microcontroller MC is inverted. Steps ST3 and ST4 are optionally provided to have as broad a setting range as possible for the oscillator OSC2 between the values Sm and SM, given that the control values S1, S2 applied to the oscillators OSC1, OSC2 differ from the deviation value ΔS. In step ST5, the control value SC1 is applied to the oscillator OSC2. In step ST6, the count value NC2 is measured on the output signal of the oscillator OSC2. In step ST7, the deviation ΔNC between the control values N1C and N2C may be optionally calculated and stored for the implementation of the equation (15).

Steps ST8 to ST14 aim to calculate the slope deviation Δp. In step ST8, the minimum control value is applied to the oscillators OSC1 and OSC2. In step ST9, the corresponding count values N1m, N2m are measured on the output signals of the oscillators OSC1, OSC2 controlled by the signal Sm. In step ST10, the deviation ΔNm is calculated using the measured count values N1m, N2m, and this deviation is stored. In step ST11, the maximum control value SM is applied to the oscillators OSC1 and OSC2. In step ST12, the corresponding count values N1M, N2M are measured on the output signals of the oscillators OSC1, OSC2 controlled by the signal SM. In step ST13, the deviation ΔNM is calculated using the measured count values N1M, N2M. In step ST14, the slope deviation Δp is calculated using the deviations ΔNM, ΔNm, and the deviation SR between the control values SM and Sm by applying the equation (12), and the slope deviation value obtained is stored.

It is clear for those skilled in the art that various other embodiments may be provided. In particular, some alternative embodiments of an oscillator may be provided. For example, instead of a ring oscillator comprising n delay circuits and only one inverter, each oscillator may comprise a plurality of inverters that are selected or unselected accordingly. Furthermore to benefit from a finer frequency pitch ΔFS, the oscillators may be produced from sources of current that can be activated on demand to increase the frequency of the oscillator.

Moreover, it will be understood by those skilled in the art that the oscillators OSC1, OSC2 are not necessarily ring oscillators, but may be any type of oscillator the frequency of which can be adjusted by regular frequency pitches, and that the frequency measuring circuits DCT1, DCT2 may be any means making it possible to determine the frequency of an oscillator otherwise than by counting a number of clock cycles between two instances of a synchronization signal. The registers REG1, REG2 are not necessarily part of the calculation unit FCT1, FCT2, and may be outside this circuit. The new frequency control value S1' may be calculated in relation to the second control value S2, but for optimum accuracy, it is preferable to calculate the control value S1' in relation to the control value S1.

It is also clear to those skilled in the art that the present disclosure also covers a device not performing any calibration phase, the values determined during this phase having merely been saved in the device during a test phase at the end of the production line.

The oscillator frequency adjusting method may also include a comparison step of comparing the count value N1 with a first and/or a second threshold value, for example 5,910 and 6,090 or 47,880 and 48,120 in the examples described above. The adjusting method can be carried out only if the count value N1 is lower than or higher than the threshold values that thus define between them a range of acceptable values.

Moreover, it will be understood from the description above, that the application of linear interpolations or extrapolations has been provided as an example only. Non-linear interpolations or extrapolations may of course be used, like polynomial interpolations or extrapolations.

Furthermore, the desired frequency values of 6 MHz and 48 MHz have only been given as an example. Any other desired frequency value may thus be used. Finally, the terms "frequency" F and "count" N may generally be exchanged in the equations and drawings.

Furthermore, embodiments may be provided in which the frequency of the second oscillator is determined within a time interval other than the one in which the frequency of the first oscillator is determined, for example two consecutive time intervals defined by the synchronization signal SNC.

The invention claimed is:

1. A method for adjusting an oscillator clock frequency, the method comprising:
    applying a first control value to a first oscillator;
    applying a second control value, different from the first control value, to a second oscillator;
    measuring a frequency of each of the first and second oscillators;
    determining, by interpolation, a new first control value depending on the frequencies measured, on the first and second control values, and on a desired frequency;
    applying the new first control value to the first oscillator; and
    determining, by interpolation, a corrected frequency measurement of the second oscillator, the corrected frequency measurement being dependent on a frequency deviation measured between the first and second oscillators when subjected to a third control value, on the third control value, and on the second control value, the corrected frequency measurement being used as a frequency measurement of the second oscillator for determining the new first control value.

2. The method according to claim 1, further comprising a calibration phase including:
    applying the third control value to each of the first and second oscillators; and
    measuring the frequency deviation between the frequencies of the first and second oscillators when subjected to the third control value.

3. The method according to claim 1, further comprising a calibration phase including:
    applying a minimum control value to each of the first and second oscillators;
    measuring a first frequency deviation between the first and second oscillators when subjected to the minimum control value;
    applying a maximum control value to each of the first and second oscillators;

measuring a second frequency deviation between the first and second oscillators when subjected to the maximum control value; and determining a slope deviation between response curves of the first and second oscillators depending on a difference between the first and second frequency deviations and on a difference between the minimum and maximum control values, the slope deviation being used to determine, by interpolation, the corrected frequency measurement.

4. The method according to claim 1, wherein the corrected frequency measurement is determined based on a frequency deviation measured between the first and second oscillators when subjected to a minimum control value, and on the minimum control value.

5. The method according to claim 1, wherein the measured frequency of the first oscillator, when subjected to the third control value, corresponds to the desired frequency.

6. The method according to claim 5, further comprising a calibration phase including:
    determining the third control value, and
    measuring the frequency of the second oscillator when subjected to the third control value.

7. The method according to claim 1, wherein each frequency measurement of the first oscillator or the second oscillator includes counting a number of cycles of the respective oscillator during a period of a synchronization signal.

8. The method according to claim 7, wherein the synchronization signal is supplied by a communication interface.

9. The method according to claim 8, further comprising supplying a signal at the frequency of the first oscillator at an output of the first oscillator as a clock signal of a device conforming to the USB 2.0 standard, the frequency of the first oscillator being equal to 6 MHz with an error margin of ±90 KHz, or to 48 MHz with an error margin of ±120 KHz.

10. The method according to claim 1, wherein the determination of the new first control value includes:
    determining a first difference between the measured frequencies of the first and second oscillators;
    determining a second difference between the desired frequency and the measured frequency of one of the first and second oscillators;
    dividing the first difference by a difference between the first and second control values applied to the first and second oscillators, to obtain a frequency pitch;
    dividing the second difference by the frequency pitch to obtain a correction value; and
    adding the correction value to the first control value to obtain the new first control value.

11. The method according to claim 10, wherein the difference between the first and second control values is a fixed value, a new second control value is determined depending on the new first control value or on the correction value to keep the difference in control values at the fixed value.

12. A frequency adjusting circuit for adjusting the frequency of an oscillator to a desired frequency, the frequency adjusting circuit comprising:
    first and second oscillators each having a frequency and being adjustable by a control value,
    the frequency adjusting circuit being configured to implement a method including:
    applying a first control value to the first oscillator;
    applying a second control value, different from the first control value, to the second oscillator;
    measuring a frequency of each of the first and second oscillators;
    determining, by interpolation, a new first control value depending on the frequencies measured, on the first and second control values, and on a desired frequency;
    applying the new first control value to the first oscillator; and
    determining, by interpolation, a corrected frequency measurement of the second oscillator, the corrected frequency measurement being dependent on a frequency deviation measured between the first and second oscillators when subjected to a third control value, on the third control value, and on the second control value, the corrected frequency measurement being used as a frequency measurement of the second oscillator for determining the new first control value.

13. The frequency adjusting circuit according to claim 12, wherein each of the first and second oscillators comprises a ring oscillator including a plurality of delay circuits that can be activated separately based on which of the first and second control values is applied.

14. The frequency adjusting circuit according to claim 12, configured to perform a calibration phase including:
    applying the third control value to each of the first and second oscillators; and
    measuring the frequency deviation between the frequencies of the first and second oscillators when subjected to the third control value.

15. The frequency adjusting circuit according to claim 12, configured to perform a calibration phase including:
    applying a minimum control value to each of the first and second oscillators;
    measuring a first frequency deviation between the first and second oscillators when subjected to the minimum control value;
    applying a maximum control value to each of the first and second oscillators;
    measuring a second frequency deviation between the first and second oscillators when subjected to the maximum control value; and
    determining a slope deviation between response curves of the first and second oscillators depending on a difference between the first and second frequency deviations and on a difference between the minimum and maximum control values, the slope deviation being used to determine, by interpolation, the corrected frequency measurement.

16. The frequency adjusting circuit according to claim 12, wherein the frequency adjusting circuit is further configured to determine the corrected frequency measurement based on a frequency deviation measured between the first and second oscillators when subjected to a minimum control value, and on the minimum control value.

17. The frequency adjusting circuit according to claim 12, wherein the measured frequency of the first oscillator, when subjected to the third control value, corresponds to the desired frequency.

18. The frequency adjusting circuit according to claim 17, configured to perform a calibration phase including:
    determining the third control value, and
    measuring the frequency of the second oscillator when subjected to the third control value.

19. The frequency adjusting circuit according to claim 12, wherein each frequency measurement of the first oscillator or the second oscillator includes counting a number of cycles of the respective oscillator during a period of a synchronization signal.

20. The frequency adjusting circuit according to claim 19, wherein the synchronization signal is supplied by a communication interface.

21. The frequency adjusting circuit according to claim 20, configured to supply a signal at the frequency of the first oscillator at an output of the first oscillator as a clock signal of a device conforming to the USB 2.0 standard, the frequency of the first oscillator being equal to 6 MHz with an error margin of ±90 KHz, or to 48 MHz with an error margin of ±120 KHz.

22. The frequency adjusting circuit according to claim 12, wherein the frequency adjusting circuit is further configured to determine the new first control value by:
   determining a first difference between the measured frequencies of the first and second oscillators;
   determining a second difference between the desired frequency and the measured frequency of one of the first and second oscillators;
   dividing the first difference by a difference between the first and second control values applied to the first and second oscillators, to obtain a frequency pitch;
   dividing the second difference by the frequency pitch to obtain a correction value; and
   adding the correction value to the first control value to obtain the new first control value.

23. The frequency adjusting circuit according to claim 22, wherein the difference between the first and second control values is a fixed value, the frequency adjusting circuit being further configured to determine a new second control value depending on the new first control value or on the correction value to keep the difference in control values at the fixed value.

24. A USB 2.0 device comprising:
an interface circuit configured to receive a data signal conforming to the USB 2.0 standard, and
a frequency adjusting circuit comprising first and second oscillators each having a frequency and being adjustable by a control value,
the frequency adjusting circuit being configured to implement a method including:
   applying a first control value to the first oscillator;
   applying a second control value, different from the first control value, to the second oscillator;
   measuring a frequency of each of the first and second oscillators;
   determining, by interpolation, a new first control value depending on the frequencies measured, on the first and second control values, and on a desired frequency;
   applying the new first control value to the first oscillator; and
   determining, by interpolation, a corrected frequency measurement of the second oscillator, the corrected frequency measurement being dependent on a frequency deviation measured between the first and second oscillators when subjected to a third control value, on the third control value, and on the second control value, the corrected frequency measurement being used as a frequency measurement of the second oscillator for determining the new first control value.

25. The USB 2.0 device according to claim 24, wherein an interface circuit supplies the frequency adjusting circuit with a synchronization signal.

* * * * *